United States Patent
Yi et al.

(10) Patent No.: US 7,520,068 B2
(45) Date of Patent: Apr. 21, 2009

(54) APPARATUS AND METHOD FOR DRYING SEMICONDUCTOR SUBSTRATES

(75) Inventors: Hun-Jung Yi, Suwon (KR); Sang-Oh Park, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 375 days.

(21) Appl. No.: 10/831,175

(22) Filed: Apr. 26, 2004

(65) Prior Publication Data

US 2005/0091871 A1   May 5, 2005

(30) Foreign Application Priority Data

Nov. 4, 2003   (KR) ...................... 10-2003-0077781

(51) Int. Cl.
 *F26B 25/06*   (2006.01)
(52) U.S. Cl. .............................. 34/218; 34/232; 34/235
(58) Field of Classification Search ................... 34/443, 34/487, 492, 565, 641, 218, 224, 225, 232, 34/233, 235; 134/61, 143, 200, 902
See application file for complete search history.

(56) References Cited

U.S. PATENT DOCUMENTS

| | | | |
|---|---|---|---|
| 5,299,584 A * | 4/1994 | Miyazaki et al. ............ | 134/902 |
| 5,369,891 A | 12/1994 | Kamikawa | |
| 6,131,588 A | 10/2000 | Kamikawa et al. | |
| 6,158,449 A * | 12/2000 | Kamikawa .................. | 134/902 |
| 6,883,248 B2 * | 4/2005 | Ko et al. ........................ | 34/78 |

FOREIGN PATENT DOCUMENTS

| | | | |
|---|---|---|---|
| DE | 3023200 A | * | 2/1981 |
| DE | 102 34 710 | | 6/2003 |
| DE | 10 2004 039 059 | | 3/2005 |
| KR | 10-0165820 | | 12/1995 |
| KR | 10-0236411 | | 9/1999 |
| KR | 2000-0013614 | | 7/2000 |
| KR | 20-0234230 | | 6/2001 |

OTHER PUBLICATIONS

English Translation of German Office Action for corresponding Application No. 10 2004 044 394.7-43 dated Jul. 8, 2007.

* cited by examiner

*Primary Examiner*—Jiping Lu
(74) *Attorney, Agent, or Firm*—Harness, Dickey & Pierce, P.L.C.

(57) ABSTRACT

A drying apparatus and method of drying a wafer including supplying a drying material for drying a wafer and controlling a flow of the drying material to uniformly or substantially dry the wafer. The flow of the drying material may be controlled by a vent unit including at least one part for controlling the flow of the drying material to uniformly or substantially uniformly dry the wafer.

27 Claims, 12 Drawing Sheets

APPARATUS AND METHOD FOR DRYING SEMICONDUCTOR SUBSTRATES

CROSS-REFERENCE TO RELATED APPLICATIONS

This application claims the benefit under 35 U.S.C. § 119 (a) of Korean Patent Application No. 2003-0077781, filed on Nov. 4, 2003, the contents of which are hereby incorporated by reference in their entirety.

BACKGROUND OF THE INVENTION

1. Field of the Invention

The present invention relates to an apparatus and method for drying semiconductor substrates, and more particularly to an apparatus and method for drying semiconductor substrates using a vent unit.

2. Description of the Related Art

Clean semiconductor substrates are useful for improving the efficiency and correct operation of a semiconductor device. Unclean semiconductor substrates can lead to problems. These problems may include inefficiency and/or incorrect function of the fabricated semiconductor.

A conventional method of cleaning semiconductor substrates involves a wet cleaning process wherein a chemical solution is used to remove impurities in the semiconductor substrate. After the wet cleaning process, it may be necessary to remove any remaining chemical solution used in the wet cleaning process from the semiconductor substrate.

A conventional method of removing a chemical solution from a semiconductor substrate following a wet cleaning process involves the passage of the semiconductor substrate through two distinct stages, a rinsing stage and a drying stage. A conventional rinse/dry apparatus, shown in FIG. 1, may include a rinsing chamber 101, a drying chamber 103, a gas supplier 105, including a gas inlet conduit 105a, and a vent 107.

During the rinsing stage, de-ionized water 109 may be supplied to the rinsing chamber 101, as shown in FIG. 1. The semiconductor wafer 111 containing the remains of the chemical solution is dipped in the de-ionized water 109. The remains of the chemical solution are removed in the rinsing chamber 101, and the de-ionized water 109 is absorbed on the surface of the rinsed semiconductor wafer 111.

Following the above described rinsing stage, a drying stage is initiated. During the drying stage, the rinsed semiconductor wafer 111 is raised from the rinsing chamber 101 to the drying chamber 103. Concurrently, a gas 115, which may be isopropyl alcohol (IPA), is injected in the interior of the drying chamber 103 from the gas supplier 105. The gas 115 injected into the drying chamber 103 is directed towards the semiconductor wafer 111. After passing over the semiconductor wafer 111, the gas 115 is exhausted through the vent 107 out of the drying chamber 103. When the semiconductor wafer 111 is sufficiently dry, the drying stage is over and the process of removing the chemical solution left on the semiconductor wafer 111 during the wet cleaning process is complete.

With conventional methods and apparatuses, water marks 113a and 133b, may remain on the semiconductor wafer 111 following the drying stage, as shown in FIG. 2. One reason water marks 113a and 133b may occur is due to uneven flow of the gas 115 during the drying stage when the gas 115 is injected into the drying chamber 103 and directed towards the semiconductor wafer 111. These water marks 113a and 133b may be formed into at least two distinct locations. The first water marks 113a may be formed on both sides of the upper portion of the semiconductor wafer 111 in the opposite direction of a plat zone 111a. The water marks 113b may be formed adjacent to the plat zone 111a.

Water marks, as described above, may cause problems in the semiconductor fabrication process, such as reducing the yield rate of the semiconductor devices produced.

SUMMARY OF THE INVENTION

Exemplary embodiments of the present invention are directed to a drying apparatus including a drying chamber for supplying a drying material for drying a wafer and a vent unit for controlling a flow of the drying material to uniformly or substantially uniformly dry the wafer.

Exemplary embodiments of the present invention are directed to a vent unit including at least one part for controlling a flow of a drying material to uniformly or substantially uniformly dry the wafer.

Exemplary embodiments of the present invention are directed to a method of drying a wafer including supplying a drying material for drying the wafer and controlling a flow of the drying material to uniformly or substantially uniformly dry the wafer.

In exemplary embodiments of the present invention, the apparatus for drying and rinsing the semiconductor substrate may include a rinsing chamber, a drying chamber, and/or a vent unit. In exemplary embodiments of the present invention, the rinsing chamber may provide sufficient space for a rinsing process as well as a wet cleaning process. In exemplary embodiments of the present invention, the rinsing chamber may comprise two or more horizontal vent slits penetrating an upper portion on opposite sides of the rinsing chamber. In an exemplary embodiment, the drying apparatus further includes a cleaning chamber containing a cleaning material for cleaning the wafer. The cleaning material is HF.

In exemplary embodiments of the present invention, the drying chamber may be positioned above the rinsing chamber and have an exposed lower portion. The exposed lower portion may allow the rinsed wafers to pass through from the rinsing chamber during a drying stage. The interior of the drying chamber may have sufficient space for the execution of the drying stage.

In exemplary embodiments of the present invention, the drying chamber may include a gas supplier, which supplies a purge gas, including but not limited to nitrogen, for exhausting contaminated air in the drying chamber during a rinse stage or the wet cleaning process. The gas supplier may further supplies a drying gas, including but not limited to IPA, during a drying stage.

In exemplary embodiments of the present invention, the drying chamber may have a first slit and a second slit penetrating through each of its lower sides.

Exemplary embodiments of the present invention may incorporate a vent unit, which may move in a horizontal direction through the first slit and the second slit in the drying chamber. In exemplary embodiments of the present invention, the vent unit may move through the first slit and the second slit, controlling flow between the rinsing chamber and the drying chamber.

In exemplary embodiments of the present invention, the vent unit may include a first door with slits and a second door with slits, which may or may not be identical, designed to move through the first slit and the second slit. The first door may move horizontally through the first slit, and the second door may move horizontally through the second slit. In exemplary embodiments of the present invention, the slits incorporated in the doors may be designed to allow the drying chamber and the rinsing chamber to be partially or fully isolated from each other. In exemplary embodiments of the present invention, the slits incorporated in the doors may control flow between the drying chamber and the rinsing chamber. Various exemplary embodiments may exist with regard to the specific formations of the slits in the first door and the second door.

In exemplary embodiments of the present invention, the flow control enabled by the vent unit may allow for uniform or more uniform distribution of the drying gas applied to the semiconductor wafer during the drying stage. Accordingly, exemplary embodiments of the present invention may reduce or eliminate the above-mentioned watermarks.

BRIEF DESCRIPTION OF THE DRAWINGS

Exemplary embodiments of the present invention will become more fully understood from the detailed description given below and the accompanying drawings, which are given for purposes of illustration only, and thus do not limit the invention.

FIG. 5c illustrates another cross-sectional view of the vent unit FIG. 5a.

FIG. 6c illustrates another cross-sectional view of the vent unit FIG. 6a.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

DETAILED DESCRIPTION OF EXEMPLARY EMBODIMENTS OF THE PRESENT INVENTION

Figure 1:
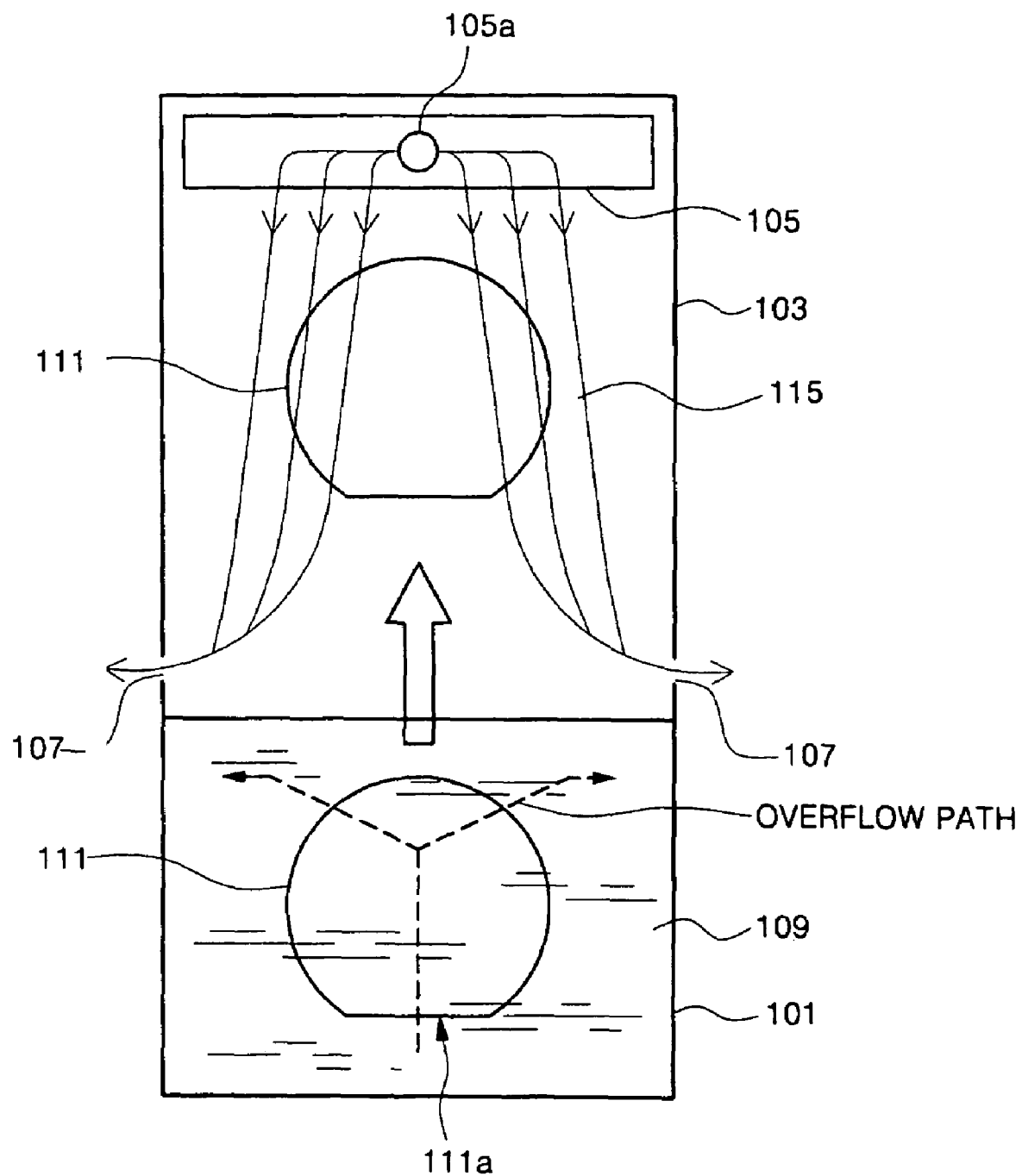
FIG. 1 illustrates a rinsing chamber and a drying chamber of a conventional apparatus.
Figure 2:
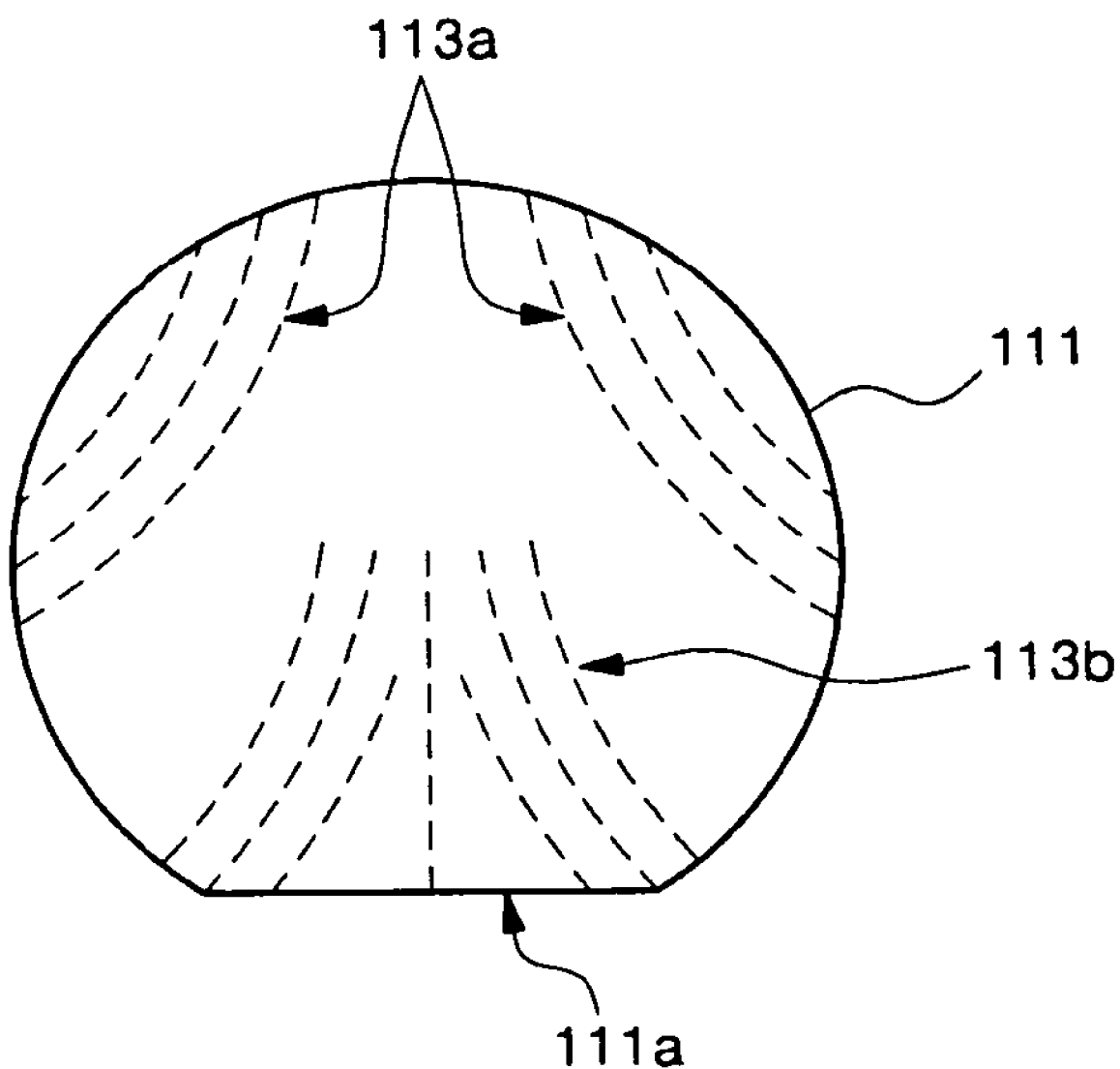
FIG. 2 illustrates a plane view of water marks formed on semiconductor substrates using a conventional apparatus.
Figure 3:
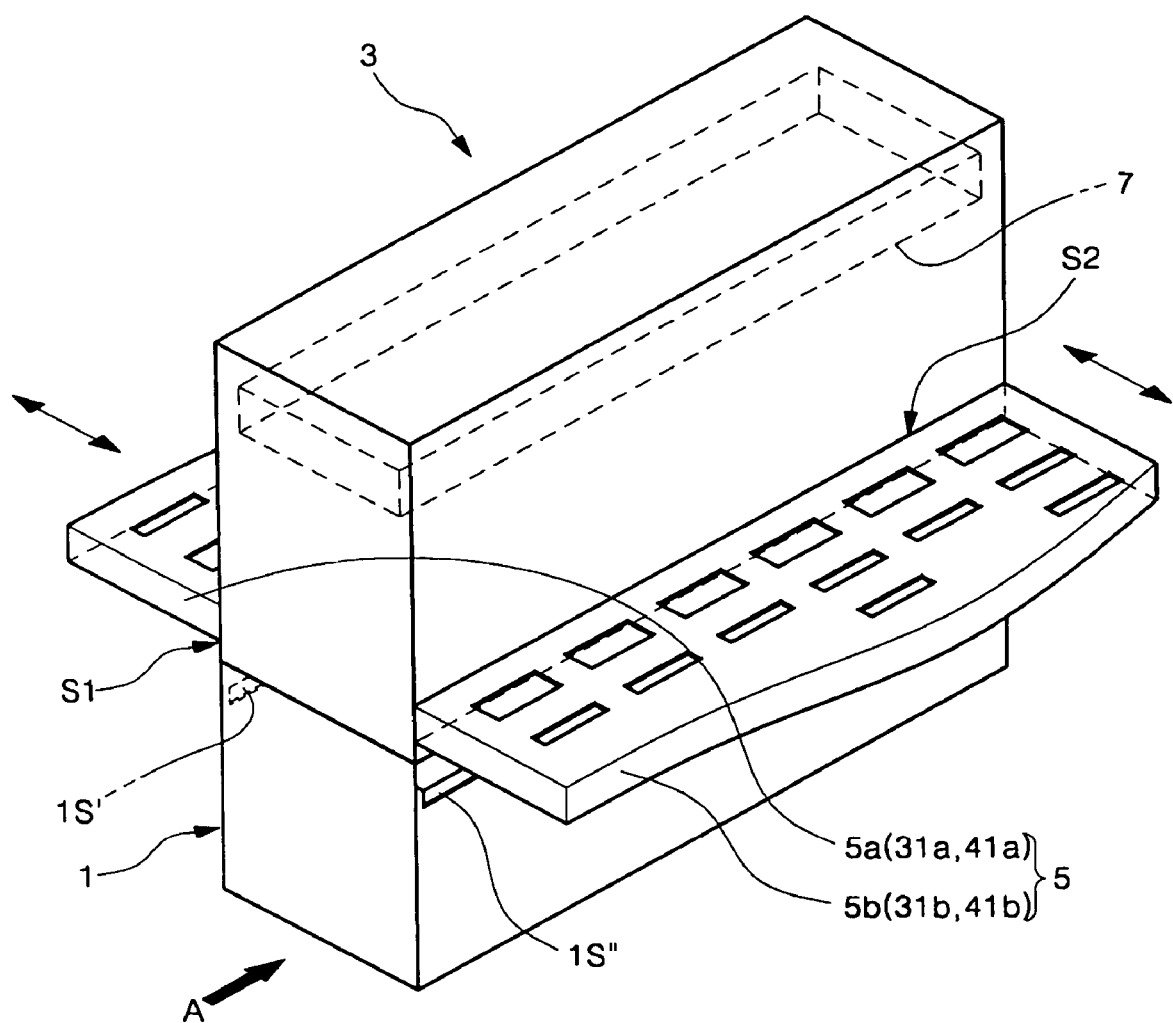
FIG. 3 illustrates a drying apparatus in accordance with an exemplary embodiment of the present invention.

A drying apparatus in accordance with an exemplary embodiment of the present invention includes a first chamber 1 and second chamber 3, as shown in FIG. 3. The first chamber 1 may provide space for a rinsing process or a cleaning process to be performed prior to a semiconductor substrate entering the drying apparatus shown in FIG. 3.

The first chamber 1 may include an opened upper portion and a first vent slit 1S' and a second vent slit 1S" through an upper portion of both sides thereof. It is noted that although FIG. 3 illustrates one first vent slit 1S' and one second vent slit 1S", any number of either vent slits could also be used, as would be evident to one of ordinary skill in the art.

The second chamber 3 may include an opened lower portion allowing semiconductor wafers (for example, rinsed semiconductor wafers) to pass therethrough from the first chamber 1 to the interior of the second chamber 3. The opened lower portion of the second chamber 3 may include space for a robot arm or other wafer moving mechanism, to assist in the drying of semiconductor wafers.

The second chamber 3 may include a gas supplier 7, which supplies a purge gas for exhausting any contaminated gas (for example, contaminated air) from the second chamber 3 during the rinse process or the cleaning process and may provide a drying gas during drying process in the second chamber 3.

The second chamber 3 may further include a first slit S1 and a second slit S2 through each of the lower part of both sides thereof. It is noted that although FIG. 3 illustrates one slit S1 and one slit S2, any number of either vent slits could also be used, as would be evident to one of ordinary skill in the art.

A vent unit 5 is movable in a horizontal or substantially horizontal direction through the slits S1,S2 thereby separating or connecting (depending on the position of the vent unit 5) the interior spaces of the first and second chambers 1, 3. The vent unit 5 may include a first slit door type exhausting unit 5a horizontally or substantially horizontally moving through the first slit S1 and a second slit door type exhausting unit 5b horizontally or substantially horizontally moving through the second slit S2. The second chamber 3 may be sealed when the first and second slit door type exhausting units 5a, 5b contact each other in the second chamber 3. In this case, the air in the second chamber 3 can be exhausted through a plurality of the vent holes formed in the first and second slit door type exhausting units 5a, 5b.

Figure 4A:
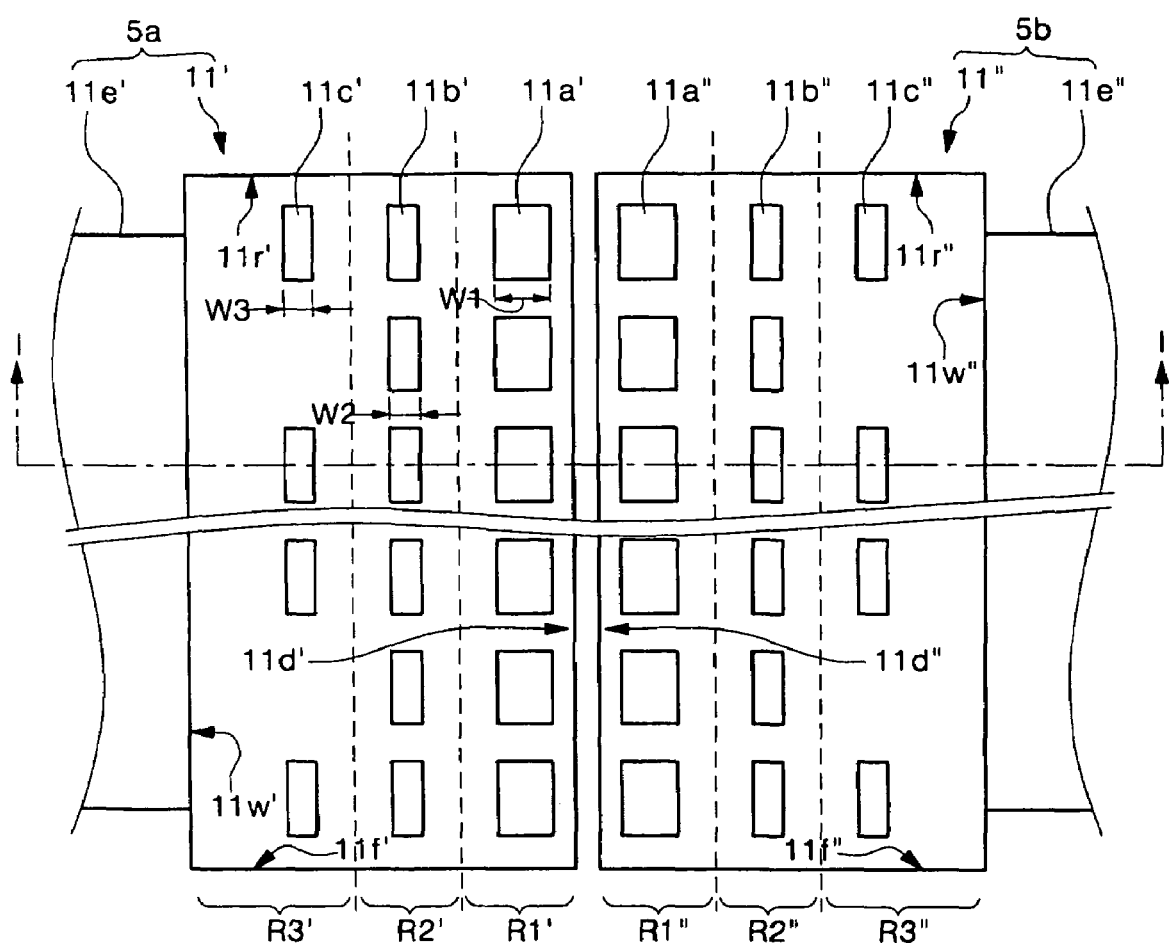
FIG. 4a illustrates a vent unit in accordance with an exemplary embodiment of the present invention and FIG. 4b illustrates a cross-section of the vent unit of FIG. 4a, along the line I-I.
Figure 4B:
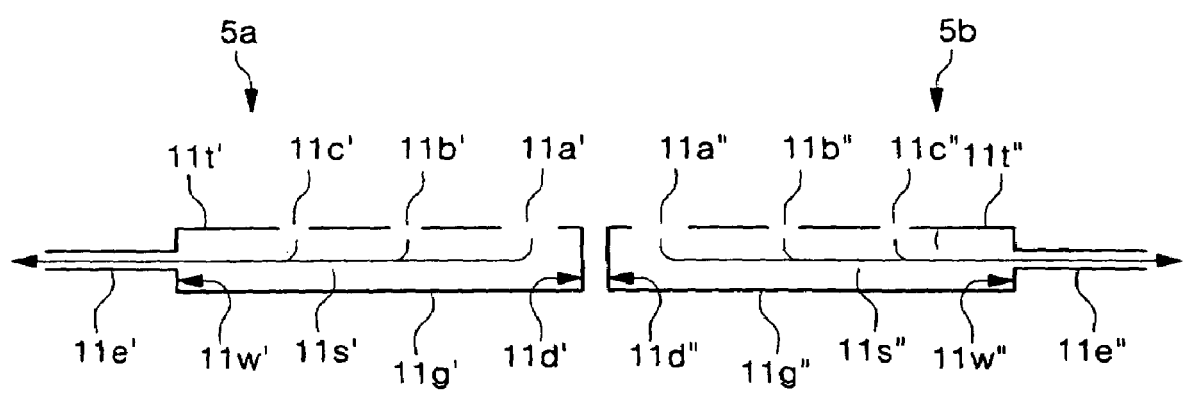

FIGS. 4a and 4b illustrate a vent unit 5 in accordance with an exemplary embodiment of the present invention. The vent unit 5 may include a first slit door type exhausting unit 5a and a second slit door type exhausting unit 5b. The first slit door type exhausting unit 5a may include a first body 11' and first exhausting conduit 11e'. The first body 11' may have a first lower panel 11g', a first inner space 11s', a first upper panel 11t', and a first wall having a first inner sidewall 11d', a first outer sidewall 11w', a first front wall 11f' and a first rear wall 11r'.

The first upper panel 11t' may have first vent holes including first, second and third groups of vent holes 11a', 11b', 11c'. It is noted that although FIGS. 4a and 4b illustrate three groups of vent holes, any number of vent hole groups (or vent holes) could also be used, as would be evident to one of ordinary skill in the art.

The first body 11' may be divided into a first center region R1', a first edge region R3', and a first intermediate region R2'. It is noted that although FIGS. 4a and 4b illustrate one center region R1', one edge region R3', and one intermediate region R2', any number of center regions R1', edge region R3', and/or intermediate regions R2' could also be used, as would be evident to one of ordinary skill in the art.

The first group of vent holes 11a' may have a first width W1, the second group of vent holes 11b' may have a second width W2, and the third group of vent holes 11c' may have a third width W3. The first, second and third groups of vent holes may all have the same length L. If the first width W1 is larger than the second and third widths W2, W3, and the second width W2 is equal to the third width W3, the first group of vent holes 11a' may be arranged with the same density (hole number) as the second group of vent holes 11b', and the third group of vent holes 11c' may be arranged with a lower density (hole number) than the second group of vent holes 11b'.

Alternatively, the first width W1 may be larger than the second width W2, and the second width W2 may be larger than the third width W3. In this case, the first, second and third groups of vent holes 11a', 11b', 11c' all may be arranged with the same density. Also, the first, second and third widths W1, W2, W3 may all be equal to each other. In this case, the first group of vent holes 11a' may be arranged at a higher density than the second group of vent holes 11b' and the third group of vent holes 11c' may be arranged at a lower density than the second group of vent holes 11b'. It is noted that other vent hole widths, lengths, densities, and/or combinations thereof could also be used, as would be evident to one of ordinary skill in the art.

The first, second and third groups of vent holes 11a', 11b', 11c' may also have various shapes, for example, a square, a circle, a rectangular, or other geometric shape. Also, the first body 11' may be divided into other regions than center, intermediate and edge regions R1, R2, R3.

The second slit door type exhausting unit 5b may be the same as or different from the first slit door type exhausting unit 5a. The second slit door type exhausting unit 5b may include elements 11", 11a", 11b", 11c", 11d", 11e", 11f", 11g", 11r", 11s", 11t", 11w", R1", R2", and R3" corresponding to elements 11', 11a', 11b', 11c', 11d', 11e', 11f', 11g', 11r', 11s', 11t', 11w', R1', R2', and R3, of the first slit door type exhausting unit 5a.

Figure 5A:
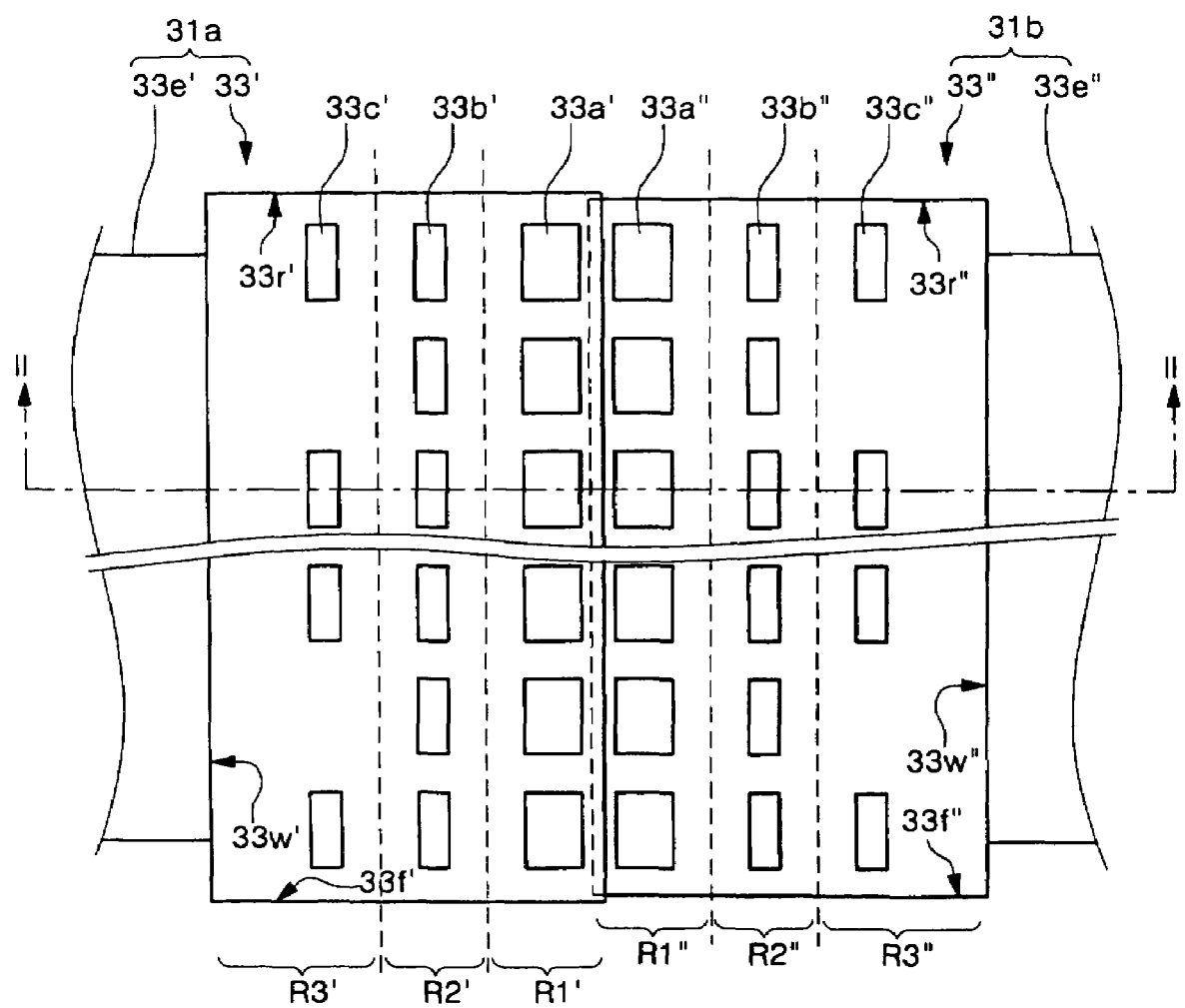
FIG. 5a illustrates a vent unit in accordance with another exemplary embodiment of the present invention and FIG. 5b illustrates a cross-section of the vent unit of FIG. 5a, along the line II-II.
Figure 5B:
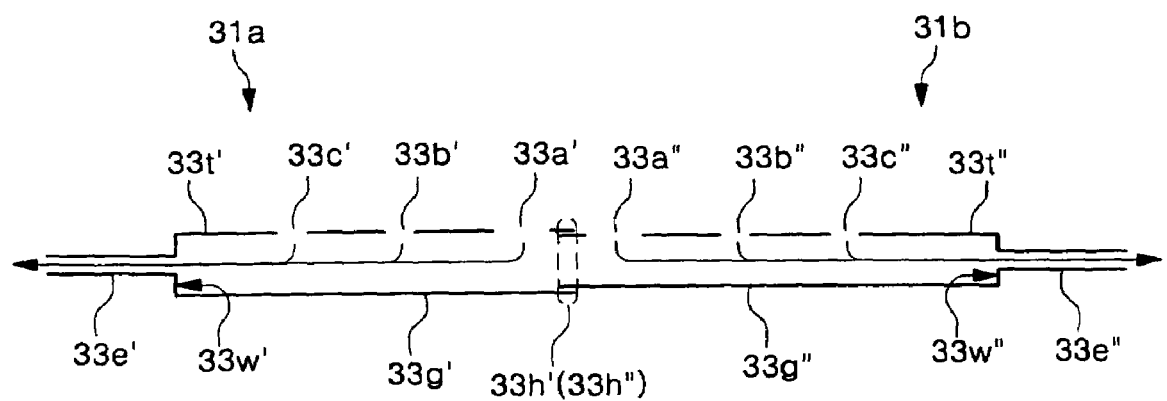
Figure 5C:
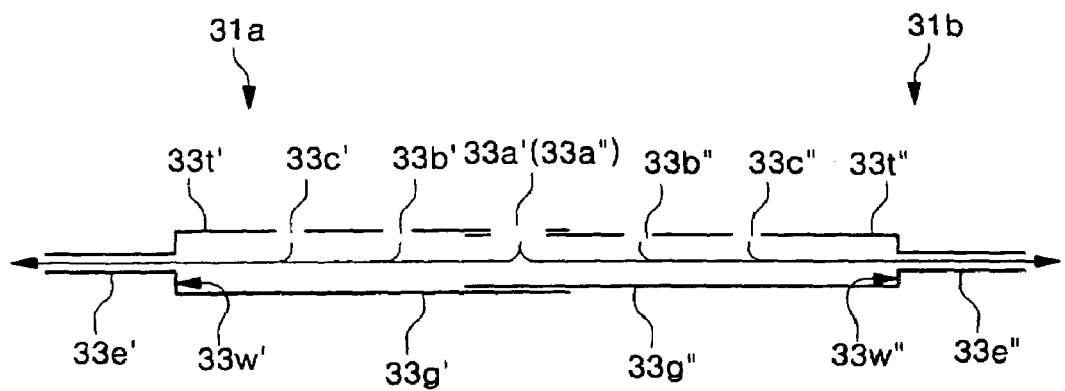

FIGS. 5a-5c illustrate a vent unit 5 in accordance with another exemplary embodiment of the present invention. The vent unit 5 may be a variable slit door type exhausting unit and may include a first slit door type exhausting unit 31a and second slit door type exhausting unit 31b inserted in the first slit door type exhausting unit 31a. The first and second slit door type exhausting units 31a, 31b may have a similar shape to the first and second slit door type exhausting units 5a, 5b for example, the first slit door type exhausting unit 31a may include a first body 33' and a first exhausting conduit 33e'.

The first body 33' may have a first upper panel 33t', a first lower panel 33g', a first front sidewall 33f', a first rear sidewall 33r', and a first outer sidewall 33w'. The first upper panel 33t' may have first, second and third groups of vent holes 33a', 33b', 33c' passing therethrough. The first body 33' may have a first opening portion 33h' opposite to the first outer sidewall 33w'.

The second slit door type exhausting unit 31b may be the same as or different from the first slit door type exhausting unit 31a. The second slit door type exhausting unit 31b may include elements 33", 33a", 33b", 33c", 33e", 33f", 33g", 33r", 33t", 33w", R1", R2", and R3" corresponding to elements 33', 33a', 33b', 33c', 33e', 33f', 33g', 33r', 33t', 33w', R1', R2', and R3, of the first slit door type exhausting unit 31a.

The second opening portion 33h" may be smaller than the first opening portion 33h'. The second chamber 3 may be sealed by contacting the first and second slit door type exhausting units 31a, 31b by inserted them in slits S1, S2, respectively, of the second chamber 3. That is, the second opening portion 33h" can be inserted in the first opening portion 33h' (or vice versa) as will be discussed below in conjunction with FIGS. 5b and 5c.

A portion of the vent holes 33a', 33b', 33c' of the first body 33' may be overlapped with a portion of the vent holes 33a", 33b", 33c" of the second body 33" by increasing the overlap between the first and second slit door type exhausting units 31a, 31b. For example, the first group of vent holes 33a' of the first body 33' can overlap with the first group of vent holes 33a" of the second body 33". In this case, a density of the vent holes arranged covering both the first and second slit door type exhausting units 31a, 31b may be decreased and a width of the variable slit door type exhausting unit including the first and second slit door type exhausting units 31a, 31b may also be decreased. As a result, the variable slit door type exhausting unit may be suitable for drying wafers having various (for example, smaller) diameters.

It is noted that the variations and/or combinations discussed above with respect to FIGS. 4a and 4b are also applicable to FIGS. 5a-5c, as would be evident to one of ordinary skill in the art.

Figure 6A:
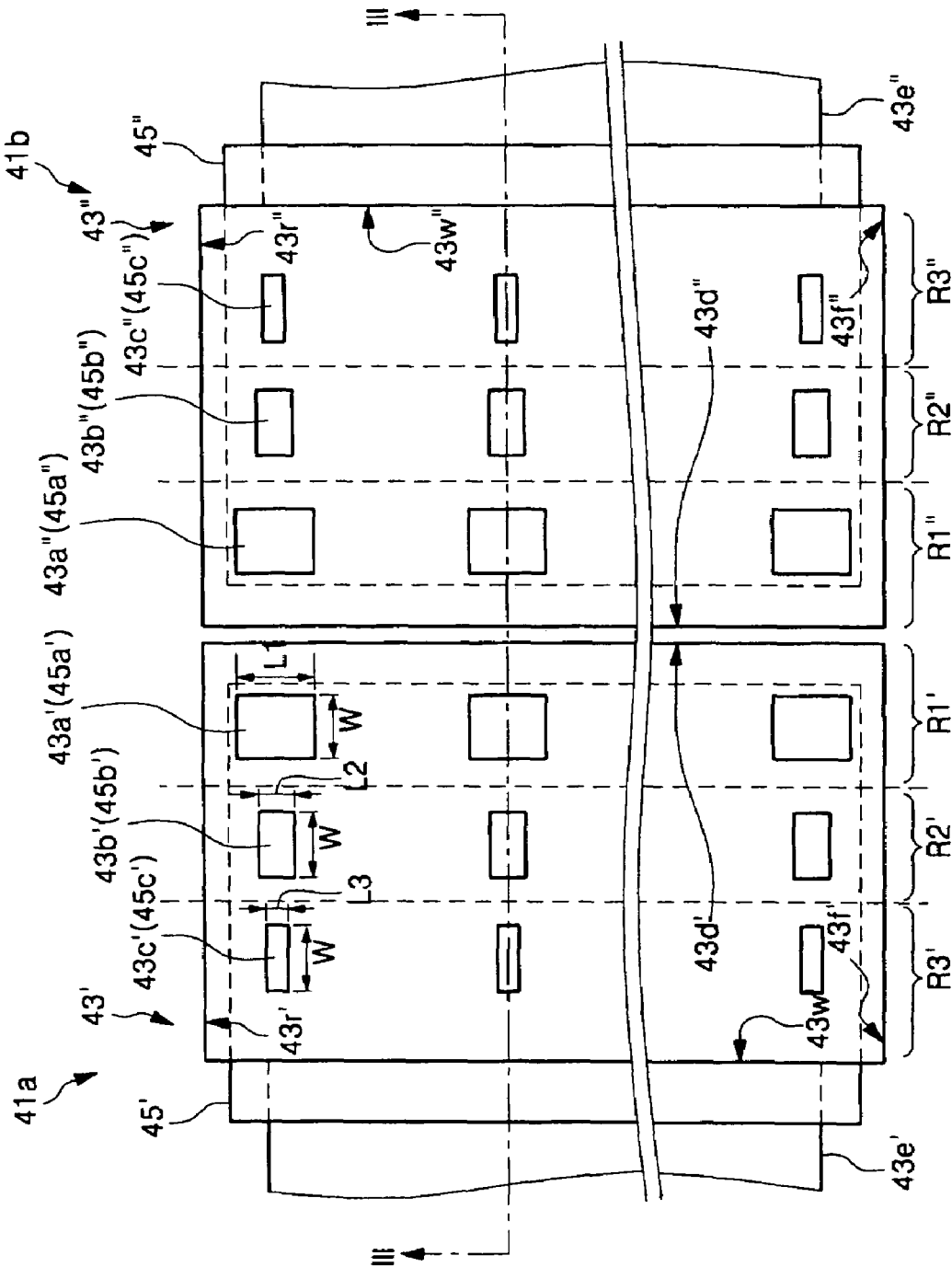
FIG. 6a illustrates a vent unit in accordance with another exemplary embodiment of the present invention and FIG. 6b illustrates a cross-section of the vent unit of FIG. 6a, along the line III-III.
Figure 6B:
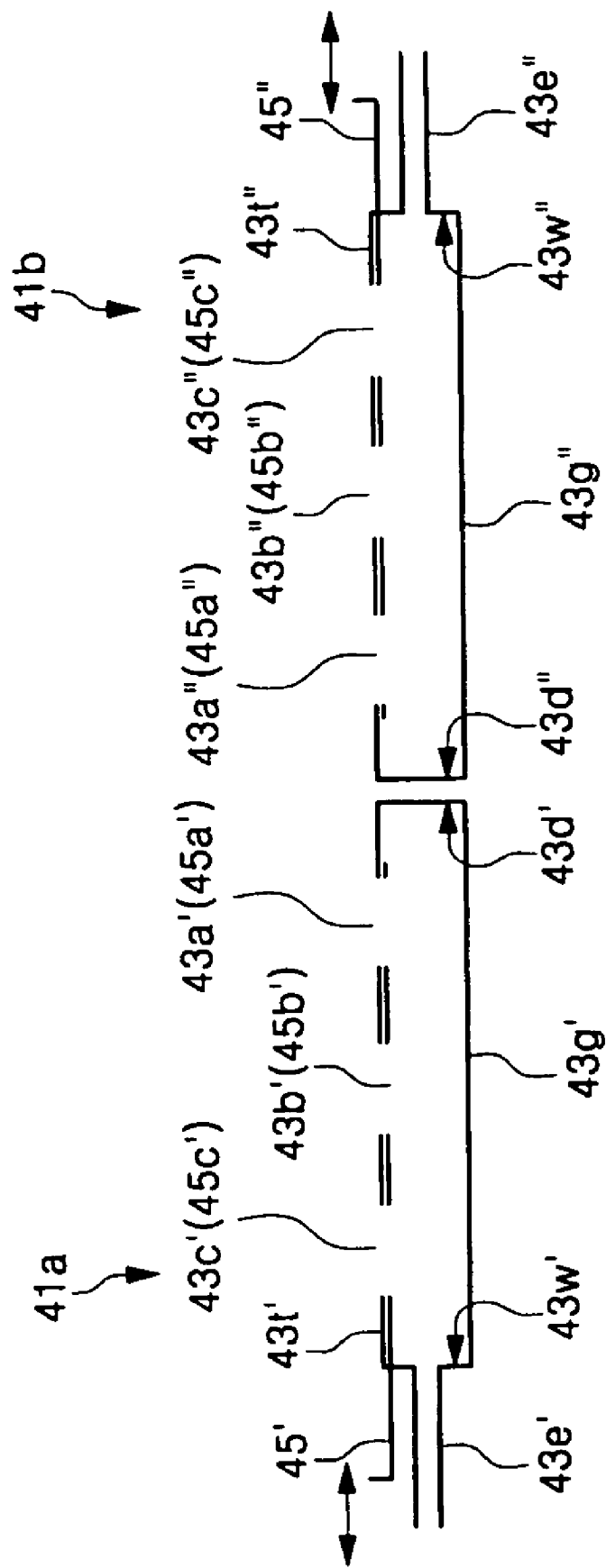
Figure 6C:
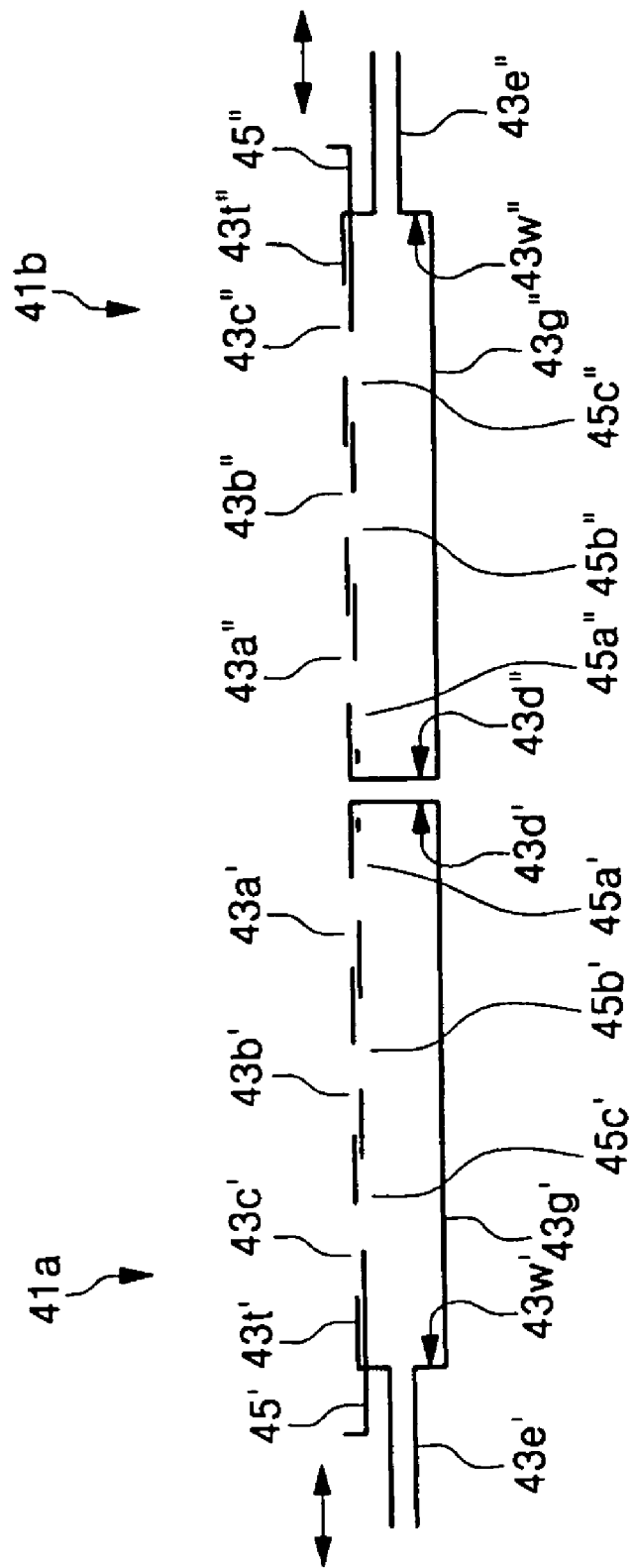

FIGS. 6a-6c illustrate a vent unit 5 in accordance with another exemplary embodiment of the present invention. The vent unit 5 may include first and second slit door type exhausting units 41a, 41b. The first and second slit door type exhausting units 41a, 41b may have a shape similar to the first and second slit door type exhausting units 5a, 5b or 31a, 31b. That is, the first slit door type exhausting unit 41a may have a first body 43' and a first exhausting conduit 43e'. Similarly, the second slit door type exhausting unit 41b may have a second body 43" and a second exhausting conduit 43e".

The second slit door type exhausting unit 41b may be the same as or different from the first slit door type exhausting unit 41a. The second slit door type exhausting unit 41b may include elements 43", 43a", 43b", 43c", 43d", 43e", 43f", 43g", 43r", 43t", 43w", R1", R2", and R3" corresponding to elements 43', 43a', 43b', 43c', 43d', 43e', 43f', 43g', 43r', 43t', 43w', R1', R2', and R3, of the first slit door type exhausting unit 41a.

The first body 43' may have a first upper panel 43t', a first lower panel 43g', a first front wall 43f', a first rear wall 43r', a first outer sidewall 43w', and a first inner sidewall 43d'. The second body 43" may have a second upper panel 43t", a second lower panel 43g", a second front wall 43f", a second rear wall 43r", a second outer sidewall 43w", and a second inner sidewall 43d".

The first and second upper panels 43t', 43t" may have first and second vent holes respectively passing therethrough. The first upper panel 43t" may have first, second and third groups of vent holes 43a', 43b', 43c' passing therethrough. The first vent holes may include first, second and third groups of vent holes 43a', 43b', 43c' passing therethrough. The second upper panel 43t" may have first, second and third groups of vent holes 43a", 43b", 43c" passing therethrough. The first, second and third groups of vent holes 43a', 43a", 43b', 43b", 43c', 43c" may all have the same width (W).

A first length L1 of the first group of vent holes 43a', 43a" may be larger than a second length L2 of the second group of vent holes 43b', 43b". A third length L3 of the third group of vent holes 43c', 43c" may be smaller than the second length L2. The first body 43' may have a first auxiliary panel 45' to vary an opened area of the vent holes 43a', 43b', 43c' of the first body 43' by sliding in the horizontal direction along a surface of the first upper panel 43t'.

The second body 43" may also have a second auxiliary panel 45" to vary an opened area of the vent holes 43a", 43b", 43c" of the second body 43" by sliding in the horizontal direction along a surface of the second upper panel 43t".

The first auxiliary panel 45' may have first, second and third groups of auxiliary vent holes 45a', 45b', 45c', which may have the same size and/or (or neither) the same arrangement as the first, second and third groups of vent holes 43a', 43b', 43c'. The second auxiliary panel 45" may have first, second and third groups of auxiliary vent holes 45a", 45b", 45c" having the same size and/or (or neither) arrangement as the first, second and third groups of vent holes 43a", 43b", 43c". If the first, second and third groups of the auxiliary vent holes 45a', 45a", 45b', 45b", 45c', 45c", respectively are completely overlapped with the first, second and third groups of the vent holes 43a', 43a", 43b', 43b", 43c', 43c", as shown in FIG. 6a and FIG. 6b by adjusting the position of first and second auxiliary panel 45', 45", the vent holes of the first and second slit door type exhausting units 41a, 41b may have the largest open area.

It is noted that the variations and/or combinations discussed above with respect to FIGS. 4a-4b and 5a-5c are also applicable to FIGS. 6a-5c6, as would be evident to one of ordinary skill in the art.

Referring to FIG. 6c, after the second chamber 3 shown in FIG. 3 is sealed by contacting the first and second slit door type exhausting units 41a, 41b with each other, a size of the opened area of the first, second and third groups of vent holes 43a', 43a", 43b', 43b", 43c', 43c" can be varied by moving the first and second auxiliary panels 45', 45" in and out in the horizontal direction.

If the first and second auxiliary panels 45', 45" are each moved half the width W toward the first and second inner sidewalls 43d', 43d", the open area of the all vent holes decreases by half without varying the density of the vent holes. As a result, the exhausting capability of the variable slit door type exhausting unit may be controlled by movement of the first and second auxiliary panels 45', 45". The variable slit door type exhausting unit may also be used to vary the pressure in the second chamber 3 after a drying process.

If a drying gas (such as drying gas 27 in FIG. 8) injected into the second chamber 3 has a normal temperature or a temperature lower than the normal temperature of the drying process, the pressure in the second chamber 3 may be lowered reduce or prevent the drying gas from condensing.

Further, if the temperature of the drying gas 27 is low and the pressure of the second chamber 3 is high, a size of the opened area of the vent holes can be made as large as possible by adjusting the first and second auxiliary panels 45', 45".

Figure 7:
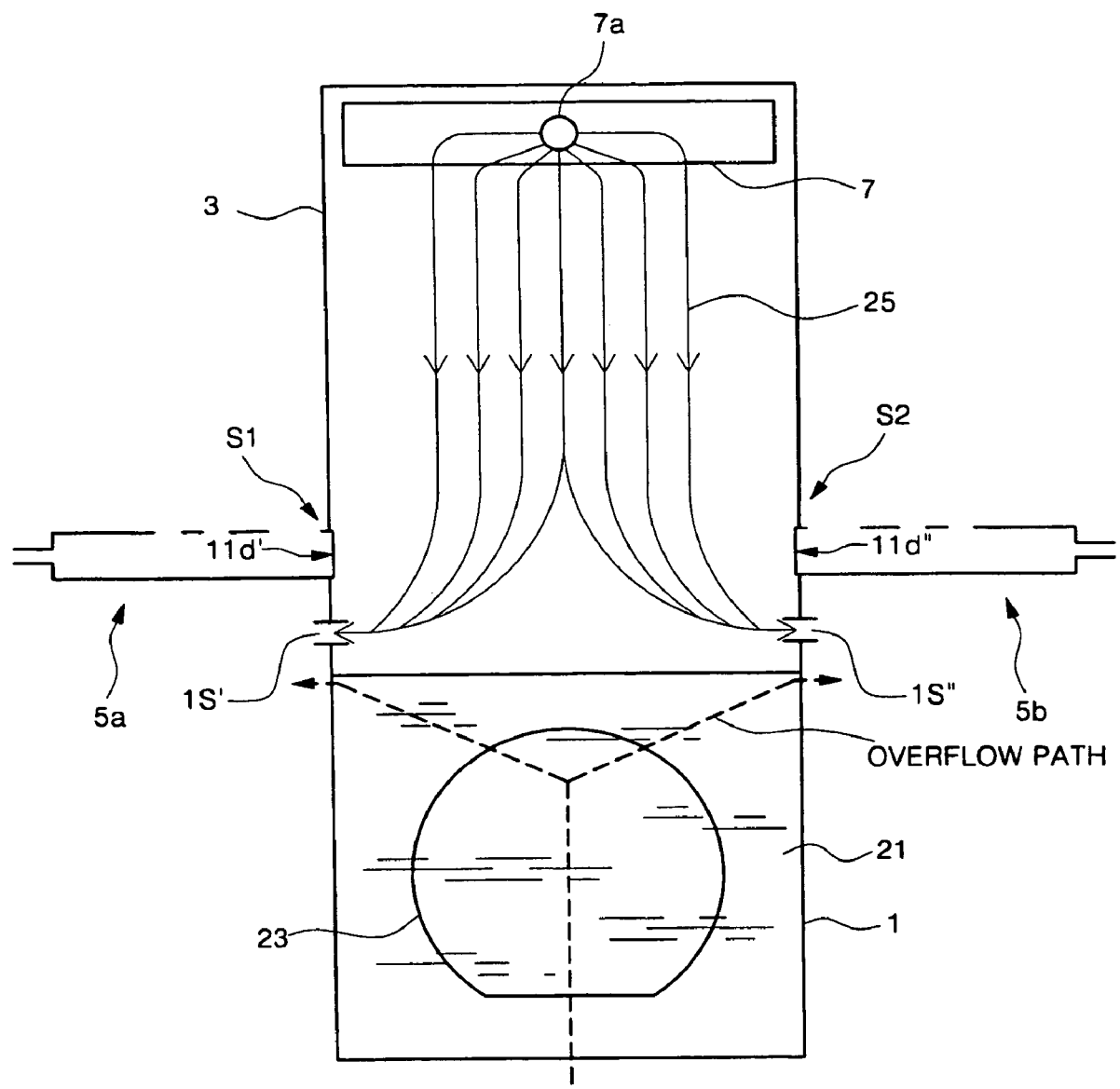
FIG. 7 illustrates a method, including a rinsing operation, in accordance with another exemplary embodiment of the present invention, incorporating a vent unit.

FIG. 7 illustrates a method, including a rinsing operation, in accordance with another exemplary embodiment of the present invention incorporating a vent unit. A rinsing liquid, for example, de-ionized water 21, is supplied into the first chamber 1 and a semiconductor wafer 23 is dipped in the de-ionized water 21 to rinse the wafer 23. The rinsing may include over-flowing the first chamber with the de-ionized water 21.

Humidity in the second chamber 3 may be uniformly or substantially uniformly maintained by injecting a purging gas 25, such as a nitrogen-based gas, into the second chamber 3 and contaminated air in the second chamber 3 may be exhausted. The purging gas 25 may be injected through the gas supplier 7 of the second chamber 3. The gas supplier 7 may include a gas inlet conduit 7a for supplying the gas, such as the purging gas 25, to the second chamber 3. During the rinsing process, the first and second slit door type exhausting units 5a, 5b, (or 31a, 31b or 41a, 41b) may be positioned in the first and second slits S1, S2 formed in opposite sidewalls of the second chamber 3. The first and second slit door type exhausting units 5a, 5b may be arranged to face the first inner sidewall 11d' and the second inner sidewall 11d", respectively.

During the rinsing process, the first and second slit door type exhausting units 5a, 5b can be positioned to achieve a desired (and maybe constant) gap therebetween. In this case, the purging gas 25 injected in the second chamber 3 may be exhausted through the first and second exhausting slits 1s', 1s" formed in the sidewalls of the second chamber 3 (or the first chamber 1). During the rinsing process, the first and second slit door type exhaustion units 5a, 5b may be repositioned in a horizontal direction closer to each other or to contact each other. That is, the second chamber 3 may be sealed by contacting the first and second inner sidewalls 11d', 11d" together In this case, the purging gas 25 injected into the second chamber 3 may be exhausted through the vent holes 11a', 11a", 11b', 11b", 11c', 11c" of the first and second exhausting units 5a, 5b.

Figure 8:
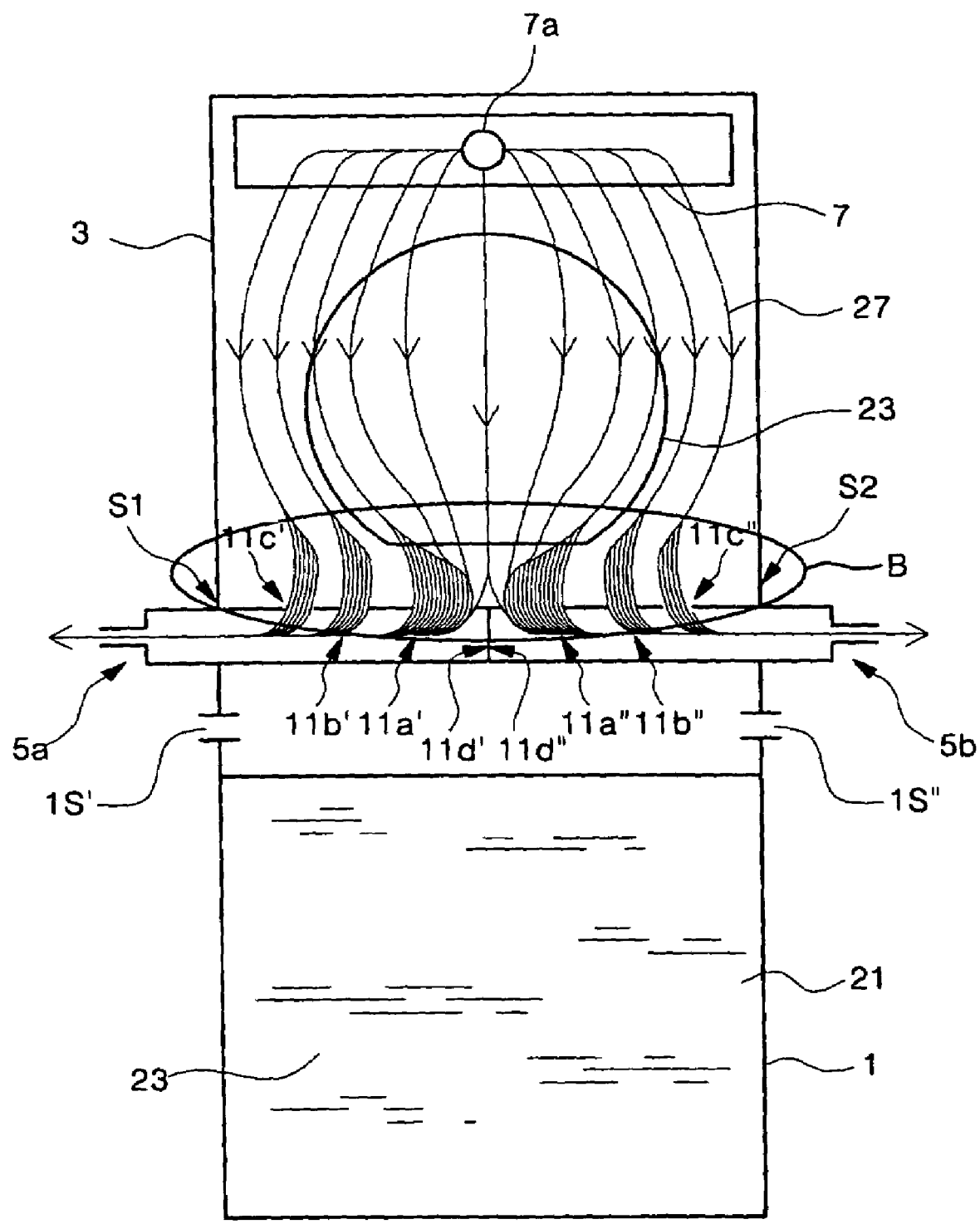
FIG. 8 illustrates a method, including a drying operation, in accordance with another exemplary embodiment of the present invention, incorporating a vent unit.

During the rinsing process, if the second chamber 3 is sealed by contacting the first and second slit door type exhausting units 5a, 5b with each other, the purging gas 25 can not be injected. As shown in FIG. 8, after completing the rinsing process, the rinsed wafer 23 may be raised and moved in the second chamber 3. During the rinsing process, if the second chamber 3 is separated by the first and second slit door type exhausting units 5a, 5b, before rising the wafer 23, a moving path for the wafer 23 is formed by separating the first and second slit door type exhausting units 5a, 5b from each other. While rinsing the wafer 23, the purging gas 25 can be supplied continuously. After the wafer 23 is raised in the second chamber 3, the first and second slit door type exhausting units 5a, 5b may be moved in the horizontal direction to thereby contact each other. That is, an opened lower portion of the second chamber 3 may be closed by the first and second slit door type exhausting units 5a, 5b. The drying gas 27 may be injected via the gas supplier 7. The drying gas 27 may be a volatile gas capable of substituting the de-ionized water by reaction with each other. For example, the drying gas 27 may be one or more of ethylglycol, 1-propanol, 2-propanol, tetrahydrofurane, 4-hydroxy-4-methyl-2-pentamone, 1-butanol, 2-butanol, methanol, ethanol, isopropyl alcohol, acetone, n-propyl alcohol and dimethylether.

Alternatively, the drying gas 27 may be supplied together with a carrier gas. In this case, the drying gas 27 may be a mixture of the carrier gas and one of ethylglycol, 1-propanol, 2-propanol, tetrahydrofurane, 4-hydroxy-4-methyl-2-pentamone, 1-butanol, 2-butanol, methanol, ethanol, isopropyl alcohol, acetone, n-propyl alcohol and dimethylether. The carrier gas may be nitrogen gas. The carrier gas may have a normal or a higher temperature. If the carrier gas has a temperature higher than a normal temperature, the drying gas 27 may also have a temperature higher than the normal temperature. For example, if the drying gas 27 is a mixture of isopropyl alcohol gas having a normal temperature and nitrogen gas having a temperature higher than the normal temperature, the isopropyl alcohol gas also may have a temperature higher than the normal temperature.

The drying gas 27 may be injected in the second chamber 3 as shown in FIG. 8 may be exhausted through the vent holes 11a', 11a", 11b', 11b", 11c', 11c" of the first and second slit door type exhausting units 5a, 5b. The vent holes 11a', 11a" may be arranged to have the highest number of holes and/or the largest size, in the region adjacent to the inner sidewalls 11d', 11d". In this arrangement, the drying effect of the drying gas 27 is highest at the first group of the vent holes 11a', 11a' adjacent the inner sidewalls 11d', 11d" as shown in FIG. 8. As a result, the drying gas 27 passing through an upper portion of the lower surfaces B of the wafer flows uniformly or substantially uniformly along a direction parallel or substantially parallel to a contour of the edge (in the example of FIG. 8, the rounded edge) of the wafer 23. Accordingly, this can reduce or eliminate water marks formed on the surface of the wafer 23.

It will be apparent to those skilled in the art that other changes and modifications may be made in the above-described exemplary embodiments without departing from the scope of the invention herein, and it is intended that all matter contained in the above description shall be interpreted in an illustrative and a limiting sense.

We claim:

1. A drying apparatus comprising:
   a drying chamber for supplying a drying material for drying a wafer, the drying chamber have at least a first slit and a second slit; and
   a vent unit for controlling a flow of the drying material to uniformly or substantially uniformly dry the wafer, the vent unit including,
      a first exhausting unit movable through the first slit, the first exhausting unit having a plurality of first vent holes for ventilating the drying chamber, and
      a second exhausting unit movable through the second slit, the second exhausting unit having a plurality of second vent holes for ventilating the drying chamber, the first exhausting unit and the second exhausting unit being movable into a first position separating the drying chamber into two chambers; wherein
      each of the first and second exhausting units further include a horizontal ventilation outlet, and wherein when the first and second exhausting units are in the first position, the drying gas is ventilated through the plurality of first vent holes and the plurality of second vent holes, and then the horizontal ventilation outlets.

2. The drying apparatus of claim 1, wherein the plurality of first and second vent holes determine a flow amount and flow pattern of the drying material through the vent unit.

3. The drying apparatus of claim 2, wherein the plurality of first and second vent holes are substantially uniform in size and distribution.

4. The drying apparatus of claim 2, wherein more of the plurality of first and second vent holes are located in a central region of the vent unit than an edge region of the vent unit.

5. The drying apparatus of claim 2, wherein more of the plurality of vent holes are located in a central region of the vent unit than an edge region of the vent unit.

6. The drying apparatus of claim 2, wherein more of the plurality of first and second vent holes and larger vent holes are located in a central region of the vent unit than an edge region of the vent unit.

7. The drying apparatus of claim 2, wherein the first and second exhausting units interact to alter a flow of the drying material through the plurality of vent holes.

8. The drying apparatus of claim 7, wherein the first and second exhausting units interact to create more of the plurality of first and second vent holes in a central region of the vent unit than an edge region of the vent unit.

9. The drying apparatus of claim 7, wherein the first and second exhausting units interact to create larger vent holes in a central region of the vent unit than an edge region of the vent unit.

10. The drying apparatus of claim 7, wherein the first and second exhausting units interact to create more of the plurality of first and second vent holes and larger vent holes in a central region of the vent unit than an edge region of the vent unit.

11. The drying apparatus of claim 10, wherein the first and second exhausting units slide in relation to each other.

12. The drying apparatus of claim 11, wherein the first exhausting unit is larger than the second exhausting unit.

13. The drying apparatus of claim 11, wherein the first exhausting unit is offset from the second exhausting unit.

14. The drying apparatus of claim 2, the vent unit including at least two auxiliary parts, which interact to alter a flow of the drying material through the plurality of first and second vent holes.

15. The drying apparatus of claim 14, wherein the first and second exhausting units and the at least two auxiliary parts create more of the plurality of first and second vent holes in a central region of the vent unit than an edge region of the vent unit.

16. The drying apparatus of claim 14, wherein the first and second exhausting units and the at least two auxiliary parts create larger vent holes in a central region of the vent unit than an edge region of the vent unit.

17. The drying apparatus of claim 14, wherein the first and second exhausting units and the at least two auxiliary parts create more of the plurality of first and second vent holes and larger vent holes in a central region of the vent unit than an edge region of the vent unit.

18. The drying apparatus of claim 17, wherein the first and second exhausting units and the at least two auxiliary parts slide in relation to each other.

19. The drying apparatus of claim 2, wherein the plurality of first and second vent holes are arranged in groups.

20. The drying apparatus of claim 19, wherein the groups vary by size.

21. The drying apparatus of claim 19, wherein the groups vary by density.

22. The drying apparatus of claim 19, wherein the groups vary by shape.

23. The drying apparatus of claim 19, wherein the groups vary by location on the vent unit.

24. The drying apparatus of claim 1, wherein the vent unit controls the flow of the drying material so more drying material flows over a central region of the vent unit than an edge region of the vent unit.

25. The drying apparatus of claim 1, wherein the vent unit is inserted into a slot in the drying chamber.

26. The drying apparatus of claim 1, wherein the vent unit includes at least one purge hole.

27. The drying apparatus of claim 1, further including,
   a first chamber for rinsing a wafer, the first chamber having at least a first vent slit and a second vent slit, wherein
      the drying material is a drying gas supplied to the second chamber by a gas supplier.

* * * * *